(12) United States Patent
Li et al.

(10) Patent No.: US 12,535,705 B2
(45) Date of Patent: Jan. 27, 2026

(54) LIGHT-EMITTING SUBSTRATE, BACKLIGHT MODULE, DISPLAY APPARATUS, AND METHOD FOR MANUFACTURING LIGHT-EMITTING SUBSTRATE

(71) Applicants: BOE MLED Technology Co., Ltd., Beijing (CN); BOE TECHNOLOGY GROUP CO., LTD., Beijing (CN)

(72) Inventors: Jiaxin Li, Beijing (CN); Donglei Li, Beijing (CN); Honghao Yu, Beijing (CN); Kun Lu, Beijing (CN); Jiwei Sun, Beijing (CN); Taotao Duan, Beijing (CN); Zhitao Zhang, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/772,279

(22) Filed: Jul. 15, 2024

(65) Prior Publication Data

US 2024/0369876 A1 Nov. 7, 2024

Related U.S. Application Data

(63) Continuation of application No. PCT/CN2022/109125, filed on Jul. 29, 2022.

(51) Int. Cl.
*G02F 1/13357* (2006.01)
*G02F 1/1335* (2006.01)
*H01L 25/16* (2023.01)

(52) U.S. Cl.
CPC .. *G02F 1/133603* (2013.01); *G02F 1/133605* (2013.01); *G02F 1/133607* (2021.01);
(Continued)

(58) Field of Classification Search
CPC ......... G02F 1/133603; G02F 1/133605; G02F 1/133606; G02F 1/133607; G02F 1/133608
See application file for complete search history.

(56) References Cited

U.S. PATENT DOCUMENTS

2007/0279936 A1* 12/2007 Song ................. G02F 1/133605
362/613
2016/0363816 A1* 12/2016 Song ................. G02F 1/133608
(Continued)

FOREIGN PATENT DOCUMENTS

| CN | 101025507 A | 8/2007 |
|---|---|---|
| CN | 102748667 A | 10/2012 |

(Continued)

OTHER PUBLICATIONS

Li et al., Display device, 2021, CN113777825A, https://worldwide.espacenet.com/patent/search/family/078834634/publication/CN113777825A?q=pn%3DCN113777825A (Year: 2021).*

(Continued)

*Primary Examiner* — Tracie Y Green
*Assistant Examiner* — Michael Chiang
(74) *Attorney, Agent, or Firm* — XSENSUS LLP

(57) ABSTRACT

A light-emitting substrate includes a substrate, and a plurality of light-emitting devices, a plurality of driver chips and a plurality of supporting structures that are all disposed on a side of the substrate. Each driver chip is electrically connected to at least one light-emitting device, and each driver chip is covered by a supporting structure of the plurality of supporting structures.

17 Claims, 13 Drawing Sheets

(52) U.S. Cl.
 CPC .. *G02F 1/133608* (2013.01); *G02F 1/133612* (2021.01); *H01L 25/167* (2013.01)

(56) References Cited

U.S. PATENT DOCUMENTS

| | | | | |
|---|---|---|---|---|
| 2019/0387629 | A1* | 12/2019 | Zhang | G02F 1/1336 |
| 2022/0003384 | A1* | 1/2022 | Lin | F21V 7/05 |
| 2022/0146883 | A1* | 5/2022 | Zhang | G02F 1/133606 |
| 2022/0317517 | A1* | 10/2022 | Yu | G02F 1/133607 |
| 2022/0367531 | A1* | 11/2022 | Han | H05K 1/189 |
| 2023/0194937 | A1* | 6/2023 | Hasegawa | G02F 1/133531 349/42 |

FOREIGN PATENT DOCUMENTS

| | | | | |
|---|---|---|---|---|
| CN | 210835515 U | * | 6/2020 | |
| CN | 214669974 U | * | 11/2021 | |
| CN | 113777825 A | * | 12/2021 | ....... G02F 1/133603 |
| JP | 2007-323857 A | | 12/2007 | |

OTHER PUBLICATIONS

Zhu et al., Lamp holder, backlight module and display device, 2021, CN214669974U, https://patents.google.com/patent/CN214669974U/en?oq=cn214669974 (Year: 2021).*

Liu et al., Support structure, backlight module and display device thereof, 2020, CN210835515U, https://worldwide.espacenet.com/patent/search/family/071256113/publication/CN210835515U?q=pn%3DCN210835515U (Year: 2020).*

International Search Report and Written Opinion mailed on Nov. 1, 2022, in corresponding PCT/CN2022/109125, 13 pages.

\* cited by examiner

LIGHT-EMITTING SUBSTRATE, BACKLIGHT MODULE, DISPLAY APPARATUS, AND METHOD FOR MANUFACTURING LIGHT-EMITTING SUBSTRATE

CROSS-REFERENCE TO RELATED APPLICATION

This application is a bypass continuation of International Patent Application No. PCT/CN2022/109125, filed on Jul. 29, 2022, which is incorporated herein by reference in its entirety.

TECHNICAL FIELD

The present disclosure relates to the field of display technologies, and in particular, to a light-emitting substrate, a backlight module, a display apparatus and a method for manufacturing the light-emitting substrate.

BACKGROUND

Mini light-emitting diode (Mini LED) display apparatus is a display apparatus that uses sub-millimeter light-emitting diodes as light-emitting devices. Compared with traditional light-emitting diode, the size of sub-millimeter light-emitting diode is greater than or equal to 80 μm and less than 500 μm.

Mini LED display apparatuses may achieve high contrast, rich level images, and vivid screen effect, and have broad future market prospects.

SUMMARY

In an aspect, a light-emitting substrate is provided. The light-emitting substrate includes: a substrate, a plurality of light-emitting devices disposed on a side of the substrate, and a plurality of driver chips and a plurality of supporting structures that are disposed on the side of the substrate. Each driver chip is electrically connected to at least one light-emitting device; a driver chip of the plurality of driver chips is covered by a supporting structure of the plurality of supporting structures.

In some embodiments, a bottom of the supporting structure is provided with an accommodating depression therein, and the driver chip is embedded in the accommodating depression.

In some embodiments, a surface of the driver chip proximate to the substrate is flush with a surface of the bottom of the supporting structure.

In some embodiments, the accommodating depression is disposed at a middle of the bottom of the supporting structure.

In some embodiments, an area of an orthographic projection of the accommodating depression on the substrate is greater than an area of an orthographic projection of the driver chip on the substrate, and the orthographic projection of the driver chip on the substrate is within the orthographic projection of the accommodating depression on the substrate.

In some embodiments, the driver chip is connected to the supporting structure through a transparent adhesive.

In some embodiments, the supporting structure includes a first supporting structure; the first supporting structure includes a first main structure; in a direction perpendicular to the substrate and from the substrate to the supporting structure, a cross-sectional area of the first main structure is gradually reduced; a bottom of the first main structure is provided with the accommodating depression therein.

In some embodiments, the supporting structure includes a second supporting structure; the second supporting structure includes a second main structure and a pedestal, and the second main structure is disposed on a side of the pedestal away from the substrate; in a direction perpendicular to the substrate and from the substrate to the supporting structure, a cross-sectional area of the second main structure is reduced; a bottom of the pedestal is provided with the accommodating depression therein.

In some embodiments, a depth of the accommodating depression is less than a thickness of the pedestal.

In some embodiments, an orthographic projection of the second main structure on the substrate is within an orthographic projection of the pedestal on the substrate.

In some embodiments, a color of an outer surface of the supporting structure is white.

In some embodiments, a reflectivity of the outer surface of the supporting structure is greater than or equal to 92%.

In some embodiments, an orthographic projection of the driver chip on the substrate is in a shape of a square, and a side length of the square is in a range of 3 cm to 3.5 cm, inclusive.

In some embodiments, the driver chip has a plurality of pins; the substrate includes a base and a circuit layer disposed on a side of the base, the circuit layer includes a plurality of connecting pad groups, and each connecting pad group includes a plurality of connecting pads; the plurality of pins of the driver chip are electrically connected to a plurality of connecting pads in a connecting pad group, respectively.

In another aspect, a backlight module is provided. The backlight module includes: the light-emitting substrate as described in any of the above embodiments in the above aspect, and a film material group disposed on a side of the plurality of supporting structures away from the substrate.

In some embodiments, the film material group includes: a diffusion plate, a lower diffusion sheet, a prism sheet and an upper diffusion sheet. The diffusion plate is disposed on a side of the plurality of supporting structures away from the substrate. The lower diffusion sheet is disposed on a side of the diffusion plate away from the light-emitting substrate. The prism sheet is disposed on a side of the lower diffusion sheet away from the light-emitting substrate. The upper diffusion sheet is disposed on a side of the prism sheet away from the light-emitting substrate.

In some embodiments, the diffusion plate and top ends of the plurality of supporting structures have a gap therebetween, and a size of the gap is in a range of 0.1 mm to 0.2 mm, inclusive.

In some embodiments, the backlight module further includes a plastic frame. The plastic frame encircles the film material group. The backlight module has a side wall extending in a light exit direction at an edge, and the plastic frame is arranged around an outer peripheral side of the side wall.

In yet another aspect, a display apparatus is provided. The display apparatus includes: the backlight module as described in any one of the above embodiments in the another aspect, and a display panel stacked on a light exit side of the backlight module.

In yet another aspect, a method for manufacturing a light-emitting substrate is provided. The method includes: providing a substrate; forming a plurality of light-emitting devices on a side of the substrate; providing a plurality of supporting structures, a bottom of each supporting structure being provided with an accommodating depression therein; embedding a driver chip in the accommodating depression to enable the driver chip and the supporting structure to form an integral structure; and transferring the integral structure formed by the driver chip and the supporting structure onto the substrate, and welding the driver chip in the integral structure onto the substrate.

BRIEF DESCRIPTION OF THE DRAWINGS

In order to describe technical solutions in the present disclosure more clearly, the accompanying drawings to be used in some embodiments of the present disclosure will be introduced briefly; obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
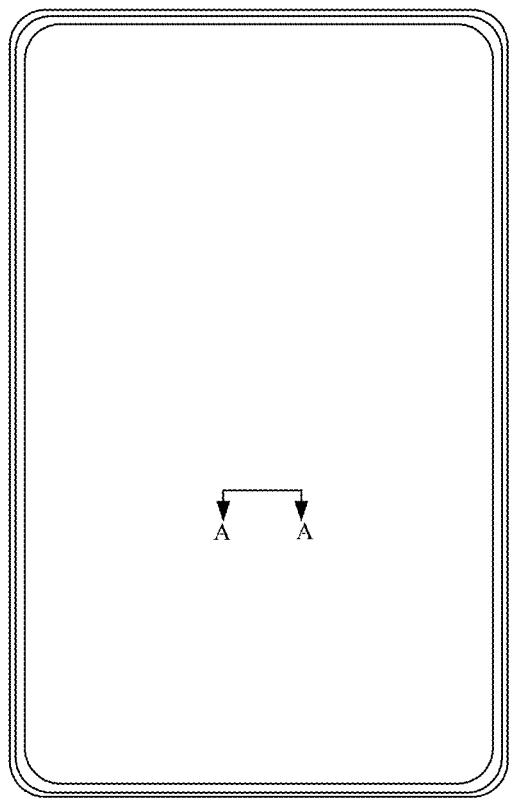
FIG. 1 is a structural diagram of a display apparatus, in accordance with some embodiments of the present disclosure.

The technical solutions in some embodiments of the present disclosure will be described clearly and completely with reference to the accompanying drawings; however, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled", "connected", and derivatives thereof may be used. For example, the term "connected" may be used in the description of some embodiments to indicate that two or more elements are in direct physical or electrical contact with each other. For another example, the term "coupled" may be used in the description of some embodiments to indicate that two or more elements are in direct physical or electrical contact. However, the term "coupled" or "communicatively coupled" may mean that two or more elements are not in direct contact with each other, but still cooperate or interact with each other. The embodiments disclosed herein are not necessarily limited to the contents herein.

The phrase "at least one of A, B, and C" has the same meaning as the phrase "at least one of A, B, or C", both including the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

As used herein, the term "if" is, optionally, construed as "when" or "in a case where" or "in response to determining that" or "in response to detecting," depending on the context. Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]."

The use of the phrase "applicable to" or "configured to" herein means an open and inclusive expression, which does not exclude devices that are applicable to or configured to perform additional tasks or steps.

In addition, the phase "based on" used is meant to be open and inclusive, since a process, step, calculation or other action that is "based on" one or more of the stated conditions or values may, in practice, be based on additional conditions or value exceeding those stated.

The term "about", "substantially", and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "parallel", "perpendicular", or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views that are schematic illustrations of idealized embodiments. In the accompanying drawings, thickness of layers and regions may be exaggerated for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, in order to achieve precise control for the light-emitting devices, a driver chip is used to control at least one light-emitting device to control the luminance of the light-emitting devices, and the light-emitting devices and the driver chip that controls the light emission of the light-emitting devices are disposed on the same substrate. Specifically, if the driver chip is large in size, for example, a side length of the driver chip is on the order of centimeters, the driver chip and the light-emitting devices are disposed on different sides of the backplane. However, with such the design, it may be possible to increase the thickness of the entire module, which is not conducive to the realization of lightness and thinness of the product. If the driver chip is small in size, for example, the side length of the driver chip is on the order of millimeters or microns, the driver chip and the light-emitting devices may be disposed on the same side of the backplane. However, this design also has the following problems. For a light-emitting backplane with a great number of light-emitting devices and a high density of arrangement, the driver chip and the light-emitting devices are disposed on the same side, it is necessary to ensure that the driver chip does not affect the optical effect of the light-emitting devices. Thus, there will be various restrictions on the overall size, appearance color, and the location of the driver chip.

In application scenarios where multiple light-emitting devices disposed in an array are used as a backlight source, the backlight source also needs to cooperate with an optical film layer. The optical film layer includes a film layer for uniform light. A distance between the optical film layer closest to the light-emitting devices and the light-emitting devices is an optical distance T. The greater the optical distance, the greater the irradiation area of a single light-emitting device incident on the optical film layer, the more fully the light emitted by adjacent light-emitting devices will be mixed. In order to achieve the optical distance between the light-emitting devices and the film layer, a supporting column may be provided between the light-emitting devices and the film layer, so that there is a certain distance between the optical film layer and the light-emitting devices.

In application scenarios where multiple light-emitting devices arranged in an array are used as a backlight source, in order to ensure the light exit effect, priority should be given to ensuring the arrangement space of the light-emitting devices and the light exit effect of the light-emitting devices. Therefore, the number of other devices (e.g., driver chips and/or supporting columns) should be reduced as much as possible.

In light of this, some embodiments in the present disclosure provide a display apparatus 1000, as shown in FIG. 1, the display apparatus 1000 may be any apparatus that displays images whether in motion (e.g., videos) or stationary (e.g., still images) and whether text or images. For example, the display apparatus 1000 may be any product or component having a display function, such as a television, a notebook computer, a tablet computer, a mobile phone, a personal digital assistant (PDA), a navigator, a wearable device, an augmented reality (AR) device, a virtual reality (VR) device.

Figure 2:
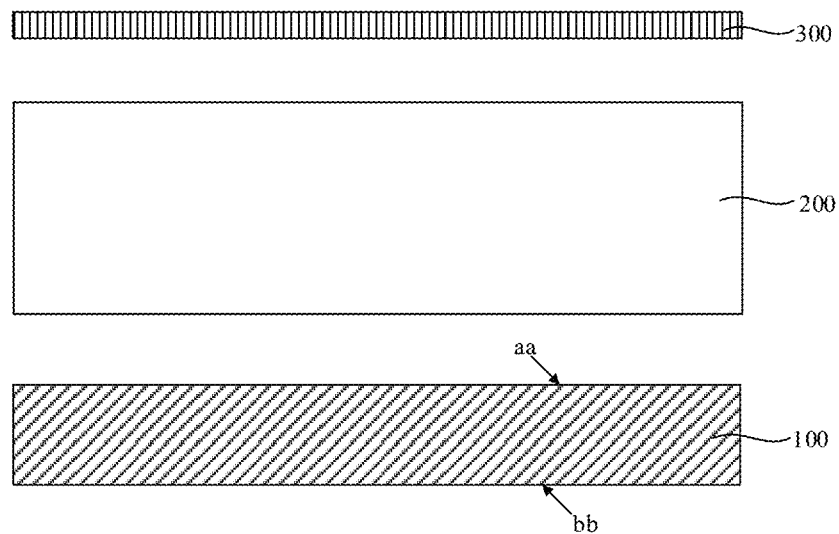
FIG. 2 is a sectional view taken along the line A-A' in FIG. 1.

In some embodiments, the display apparatus 1000 may be a liquid crystal display (LCD) apparatus. As shown in FIG. 2, the display apparatus 1000 includes a backlight module 100 and a display panel 200. The backlight module 100 includes a light exit side aa and a backlight side bb. The light exit side aa refers to a side of the backlight module 100 that emits light, and the backlight side bb refers to another side of the backlight module 100 opposite to the light exit side aa. The backlight module 100 may be used to provide a light source for the display panel 200, and the display panel 200 is disposed on the light exit side aa of the backlight module 100. In some other embodiments, the display apparatus 1000 may further include a glass cover plate 300 disposed on a side of the display panel 200 away from the backlight module 100, and the glass cover plate 300 is used for protecting the display panel 200.

Figure 3A:
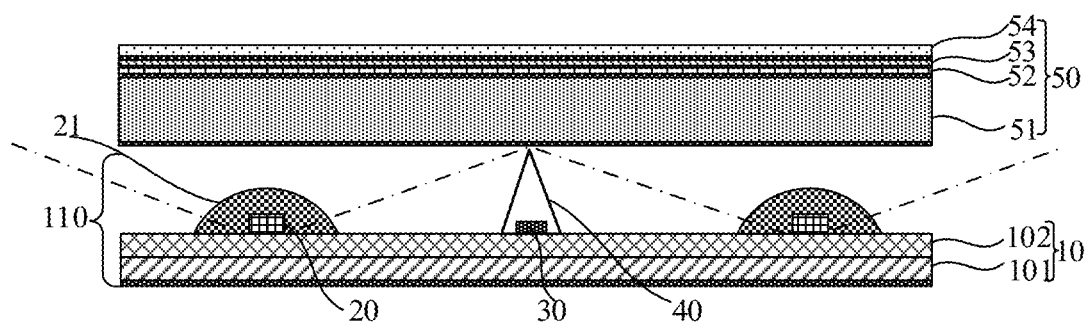
FIG. 3A is a structural diagram of a backlight module, in accordance with some embodiments of the present disclosure.
Figure 3B:
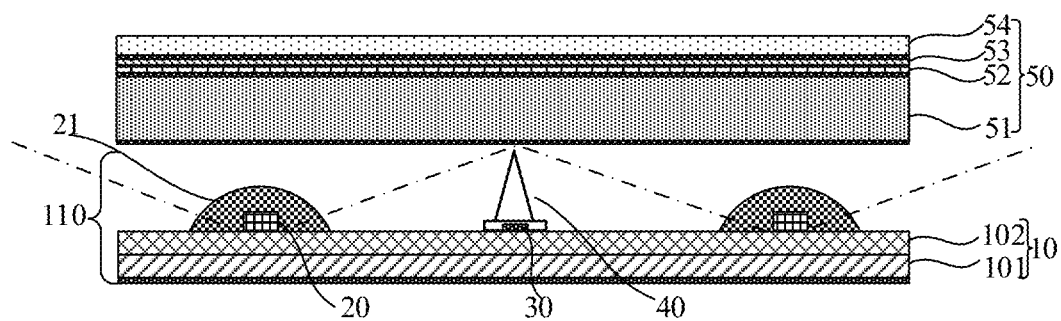
FIG. 3B is a structural diagram of another backlight module, in accordance with some embodiments of the present disclosure.

In some embodiments, as shown in FIGS. 3A and 3B, the backlight module 100 includes a light-emitting substrate 110. The light-emitting substrate 110 includes a substrate 10 and a plurality of light-emitting devices 20, a plurality of driver chips 30 and a plurality of supporting structures 40 that are disposed on a side of the substrate 10. Each driver chip 30 of the plurality of driver chips 30 is electrically connected to at least one light-emitting device 20, and each driver chip 30 of the plurality of driver chips 30 is covered by a supporting structure 40 of the plurality of supporting structures 40.

In some embodiments, each of the plurality of supporting structures 40 is disposed on a driver chip 30, and the plurality of supporting structures 40 cover the plurality of driver chips 30 in one-to-one correspondence. In some other embodiments, some supporting structures 40 of the plurality of supporting structures 40 cover the respective driver chips 30, and some other supporting structures 40 may be independently disposed on the surface of the substrate 10 as a support. That is, there is no absolute corresponding relationship between the number of the supporting structures 40 and the number of the driver chips 30. In this way, the supporting structure 40 may play a supporting role, and may also protect the driver chips 30, which may isolate moisture and oxygen, and prevent the driver chips 30 from being corroded by moisture and oxygen.

For example, each driver chip 30 of the plurality of driver chips 30 is covered by a respective supporting structure 40 of the plurality of supporting structures 40. The plurality of driver chips 30 are in one-to-one correspondence with the plurality of supporting structures 40; each driver chip 30 is disposed at the bottom of a respective supporting structure 40, and the supporting structure 40 covers the driver chip 30. The supporting structure 40 is integrated with the driver chip 30, and the supporting structure 40 may be equivalent to an encapsulation structure for the driver chip 30, which may isolate the moisture and oxygen to protect the driver chip 30. Moreover, the supporting structure 40 has a certain supporting effect and may replace the supporting column provided in the module in the related art, which may reduce the number of devices disposed in the light-emitting substrate 110, thereby reducing the impact on the optical image due to too many devices, and reducing the risks of uneven display brightness and various defects caused by the uneven display brightness. Furthermore, the supporting structure 40 is integrated with the driver chip 30, so that the size of the driver chip 30 does not need to be limited to the order of microns. Thus, it may be possible to increase the area of the driver chip 30, which may increase the contact area between the pad and the pin, thereby reducing the difficulty of die bonding, and reducing pseudo soldering. In the light-emitting substrate 110 provided by the embodiments of the present disclosure, it is possible to achieve that the driver chips 30 and the light-emitting devices 20 are disposed on the same side of the substrate 10 while the uniform light performance is satisfied, which reduces the thickness of the light-emitting substrate 110, so that the backlight module 100 may be made lightness and thinness.

It will be understood that each driver chip 30 of the plurality of driver chips 30 is electrically connected to a light-emitting device 20, or that each driver chip 30 of the plurality of driver chips 30 is electrically connected to multiple light-emitting devices 20. The number of driver chips 30 and the number of light-emitting devices 20 are not limited in the present disclosure, as long as the light-emitting substrate 110 is ensured to emit light normally.

For example, the light-emitting device 20 is a mini light-emitting diode. The driver chip 30 may be configured to control the light-emitting state of at least one light-emitting device 20, for example, to control whether the at least one light-emitting device 20 emits light. For example, one driver chip 30 may control the light-emitting state of four light-emitting devices 20. Alternatively, for example, one driver chip 30 may control the light-emitting state of eight light-emitting devices 20. The number of light-emitting devices 20 controlled by one driver chip 30 is not limited in the present disclosure, as long as the light-emitting substrate 110 is made emit light normally.

For example, as shown in FIGS. 3A and 3B, an encapsulation portion 21 is provided on the periphery of each light-emitting device 20; the encapsulation portion 21 is in a shape of a semicircle and may be made of transparent silicone. The encapsulation portion 21 is mainly used to protect the light-emitting device 20. For example, the encapsulation portion 21 may prevent moisture and oxygen from covering the light-emitting device 20, and may also prevent the light-emitting device 20 from being collided with other components.

Figure 4:
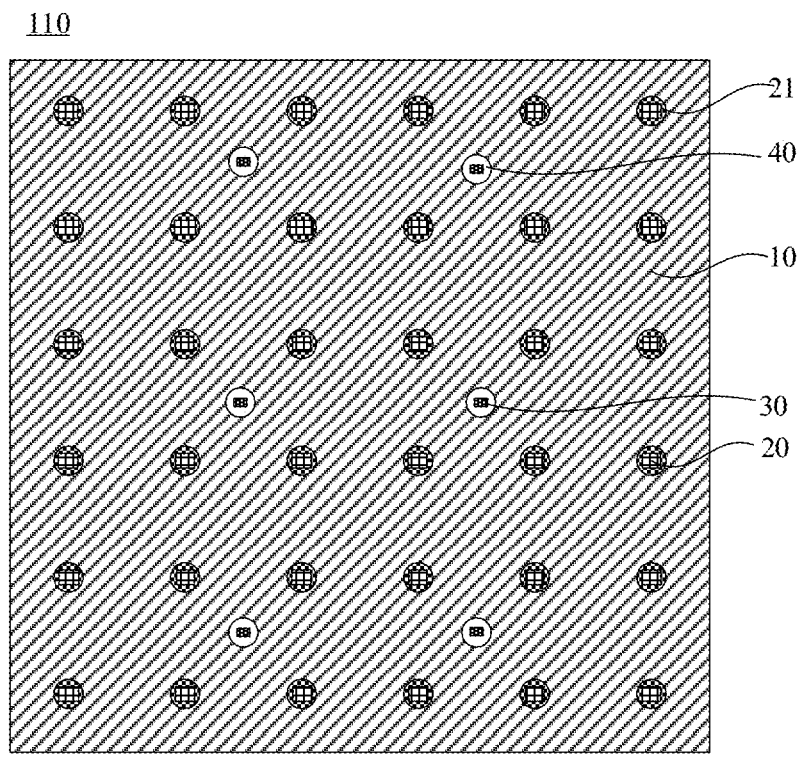
FIG. 4 is a top view of a light-emitting substrate, in accordance with some embodiments of the present disclosure.

For example, referring to FIG. 4, the plurality of light-emitting devices 20 and the plurality of supporting structures 40 are arranged on the substrate 10 in an array, and each driver chip 30 of the plurality of driver chips 30 is covered by a supporting structure 40 of the plurality of supporting structures 40. It will be understood that an orthographic projection of a supporting structure 40 on the substrate 10 may cover an orthographic projection of a driver chip 30 on the substrate 10. Therefore, the number of driver chips 30 is consistent with the number of supporting structures 40. In addition, the supporting structure 40 may be used to protect the driver chip 30 to isolate moisture, oxygen and other tiny electrolytes.

Figure 5A:
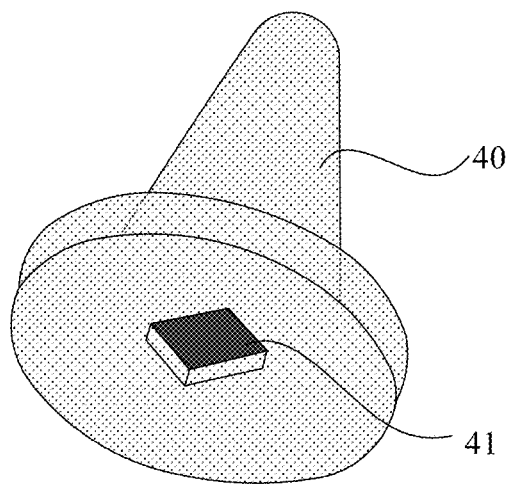
FIG. 5A is a structural diagram of a supporting structure, in accordance with some embodiments of the present disclosure.
Figure 5B:
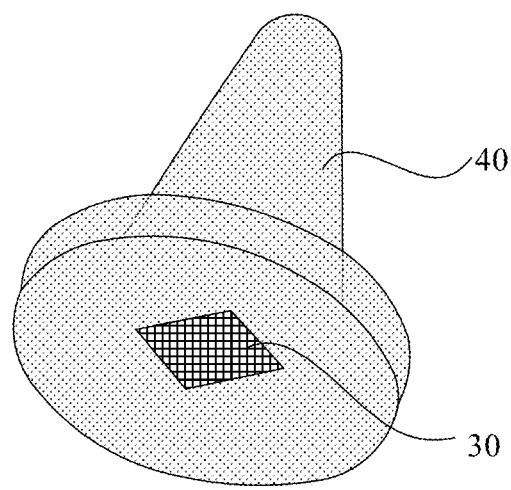
FIG. 5B is diagram showing an installation position of a driver chip, in accordance with some embodiments of the present disclosure.

In some embodiments, as shown in FIGS. 5A and 5B, a bottom of the supporting structure 40 is provided with an accommodating depression 41 therein, and the driver chip 30 is embedded in the accommodating depression 41.

For example, the accommodating depression 41 is opened upward along a partial region of a plane where the bottom of the supporting structure 40 is located. The accommodating depression 41 has a certain depth to facilitate that the entire driver chip 30 is embedded in the accommodating depression 41.

In some embodiments, a surface of the driver chip 30 proximate to the substrate 10 is flush with a surface of the bottom of the supporting structure 40.

It will be understood that the surface of the driver chip 30 proximate to the substrate 10 has no protrusion or depression relative to the surface of bottom of the supporting structure 40, that is, the surface of the drive chip 30 proximate to the substrate 10 is flush with the surface of the bottom of the supporting structure 40. In this way, in a case where the driver chip 30 is welded to the surface of the substrate 10, an enclosed space may be formed between the accommodating depression 41 in the bottom of the supporting structure 40 and the substrate 10 to avoid gaps, so that the supporting structure 40 may seal the driver chip 30 inside the enclosed space, so as to isolate moisture and oxygen to prevent the driver chip 30 from being corroded by the moisture and oxygen.

In some embodiments, the accommodating depression 41 is disposed at the middle of the bottom of the supporting structure 40.

For example, a geometric center of the accommodating depression 41 and a center of the bottom of the supporting structure 40 are located in a same straight line.

In some embodiments, an area of an orthographic projection of the accommodating depression 41 on the substrate 10 is greater than an area of an orthographic projection of the driver chip 30 on the substrate 10, and the orthographic projection of the driver chip 30 on the substrate 10 is within the orthographic projection of the accommodating depression 41 on the substrate 10.

It will be noted that the area of the orthographic projection of the accommodating depression 41 on the substrate 10 is a sum of an area of the orthographic projection of the driver chip 30 on the substrate 10 and an area of an orthographic projection of a space between the accommodating depression 41 and the driver chip 30 on the substrate 10. Therefore, the area of the orthographic projection of the accommodating depression 41 on the substrate 10 is greater than the area of the orthographic projection of the driver chip 30 on the substrate 10, and the orthographic projection of the driver chip 30 on the substrate 10 is within the orthographic projection of the accommodating depression 41 on the substrate 10.

In some embodiments, the driver chip 30 is connected to the supporting structure 40 through a transparent adhesive.

Figure 6A:
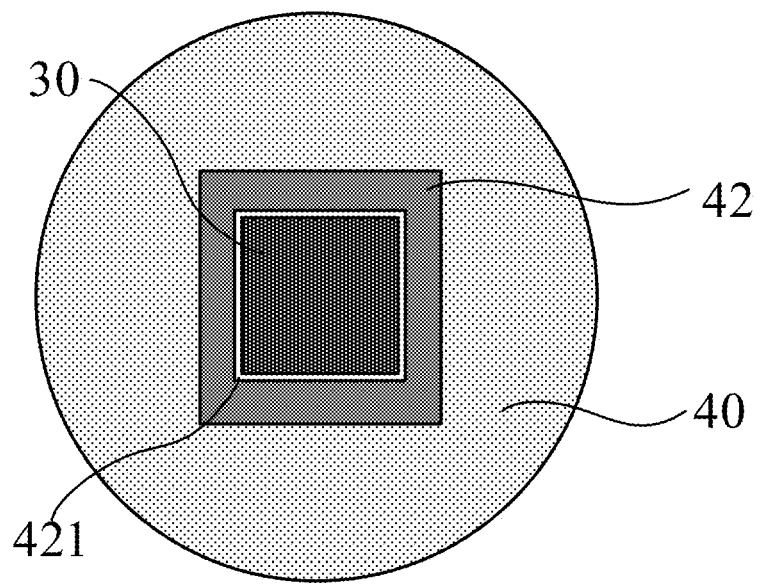
FIG. 6A is a structural diagram of a card slot, in accordance with some embodiments of the present disclosure.
Figure 6B:
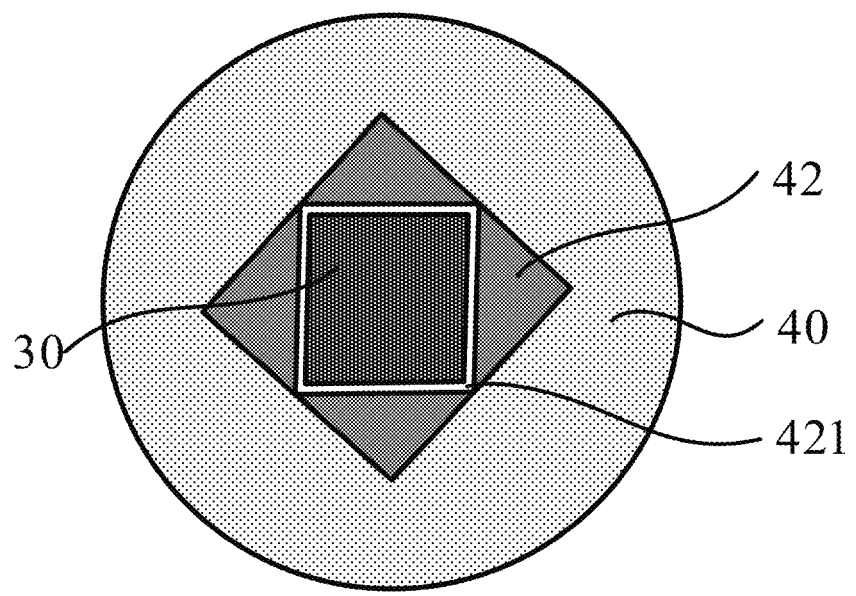
FIG. 6B is a structural diagram of another card slot, in accordance with some embodiments of the present disclosure.
Figure 6C:
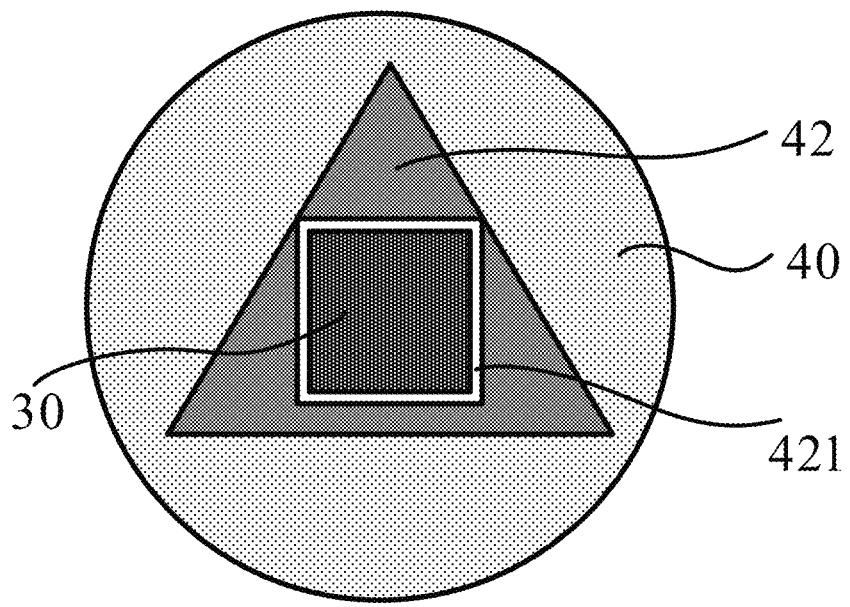
FIG. 6C is a structural diagram of yet another card slot, in accordance with some embodiments of the present disclosure.

For example, as shown in FIGS. 6A to 6C, the bottom of the supporting structure 40 is provided with a card slot 42 thereon, and the lower surface of the card slot 42 is flush with the lower surface of the supporting structure 40, that is, the fitting part between the bottom of the supporting structure 40 and the card slot 42 is recessed inwards; the center of the card slot 42 coincides with the center of the accommodating depression 41. The middle of the card slot 42 is provided with an opening 421 corresponding to of the accommodating depression 41 in position and having the same size as the accommodating depression 41. An orthographic projection of the outer contour of the card slot 42 on the bottom of the supporting structure 40 is in a shape of a polygon, such as a square, a rhombus or a triangle, and the shape is not limited here.

The bottom of the supporting structure 40 is further provided with at least one marking point; for example, the number of marking points is two, four, six, or the like; the contact surface of the card slot 42 and the bottom of the supporting structure 40 is provided with positioning points, and the positioning points correspond to the marking points in position. Therefore, the card slot 42 may limit the deviation that occurs during the assembly process of the driver chip 30 and the supporting structure 40. In addition, four sides of the opening 421 correspond to the four sides of the driver chip 30, and the size of at least one side of the opening 421 is greater than the size of the side of the driver chip 30 corresponding to the side. When placing the driver chip 30, there is a certain space between the rectangular opening 421 and the driver chip 30, and the transparent adhesive is injected into this space, so that other surfaces of the driver chip 30 except the bottom surface away from the supporting structure 40 are embedded in the card slot 42 or the accommodating depression 41 through the transparent adhesive; here, the transparent adhesive may act as a bonding agent, and may also isolate moisture and oxygen to protect the driver chip 30.

For example, the outer contour of the card slot 42 shown in FIG. 6A is in a shape of a square, and the middle of the card slot 42 is provided with a rectangular opening 421; a size of a side of the rectangular opening 421 is greater than a size of a side of the driver chip 30 corresponding to the side. When placing the driver chip 30, a certain space is left between the rectangular opening 421 and the driver chip 30, the transparent adhesive is injected into this space to fix the driver chip 30; the area of the orthographic projection of the rectangular opening 421 on the substrate 10 is greater than the area of the orthographic projection of the driver chip 30 on the substrate 10.

For example, the outer contour of the card slot 42 shown in FIG. 6B is in a shape of a rhombus, and the middle of the card slot 42 is provided with a rectangular opening 421; a size of a side of the rectangular opening 421 is greater than a size of a side of the driver chip 30 corresponding to the side. When placing the driver chip 30, a certain space is left between the rectangular opening 421 and the driver chip 30, the transparent adhesive is injected into this space to fix the driver chip 30; the area of the orthographic projection of the rectangular opening 421 on the substrate 10 is greater than the area of the orthographic projection of the driver chip 30 on the substrate 10.

For example, the outer contour of the card slot 42 shown in FIG. 6C is in a shape of a triangle, and the middle of the card slot 42 is provided with a rectangular opening 421; a size of a side of the rectangular opening 421 is greater than a size of a side of the driver chip 30 corresponding to the side. When placing the driver chip 30, a certain space is left between the rectangular opening 421 and the driver chip 30, the transparent adhesive is injected into this space to fix the driver chip 30; the area of the orthographic projection of the rectangular opening 421 on the substrate 10 is greater than the area of the orthographic projection of the driver chip 30 on the substrate 10.

Figure 7A:
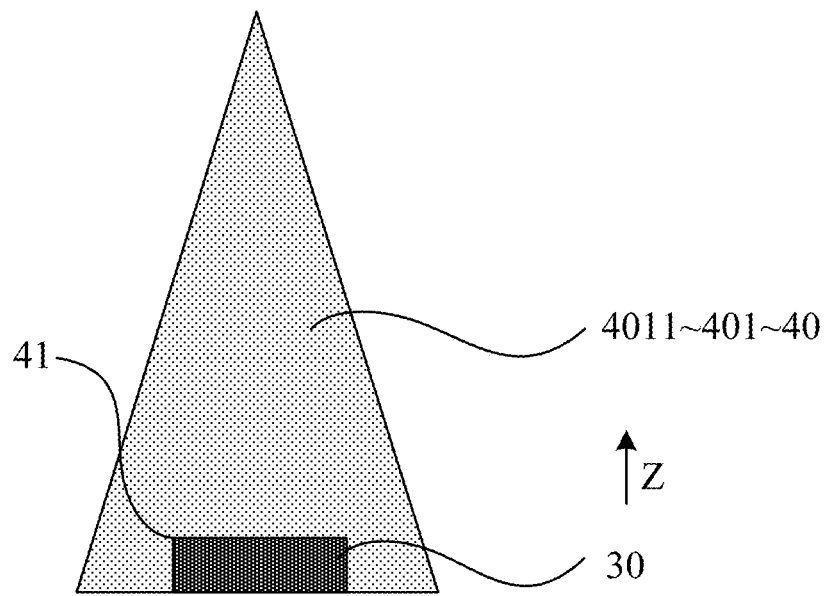
FIG. 7A is a structural diagram of a supporting structure, in accordance with some embodiments of the present disclosure.
Figure 7B:
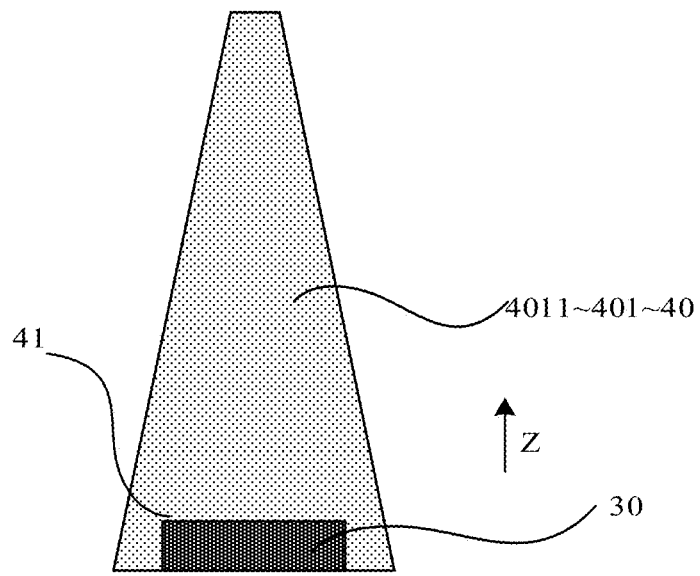
FIG. 7B is a structural diagram of another supporting structure, in accordance with some embodiments of the present disclosure.
Figure 7C:
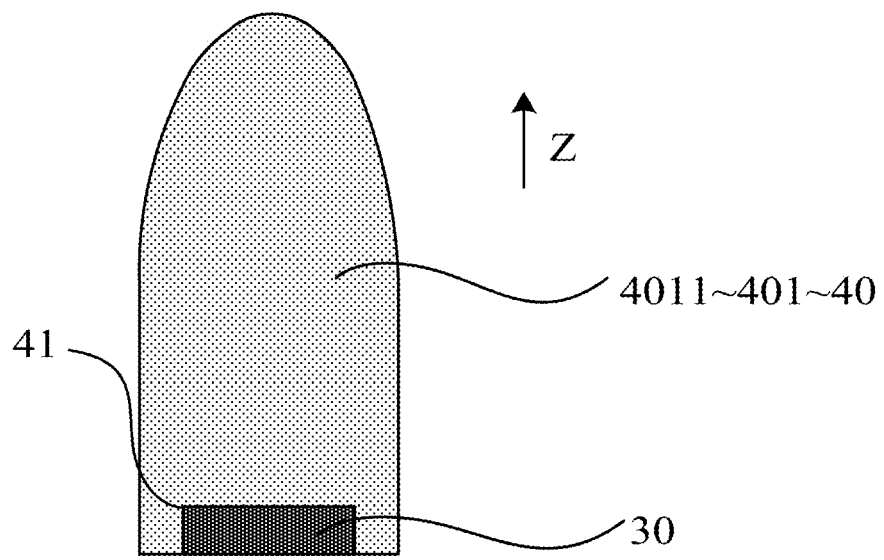
FIG. 7C is a structural diagram of yet another supporting structure, in accordance with some embodiments of the present disclosure.

In some embodiments, as shown in FIGS. 7A to 7C, the supporting structure 40 includes a first supporting structure 401; the first supporting structure 401 includes a first main structure 4011, and in a direction Z perpendicular to the substrate 10 and from the substrate 10 to the supporting structure 40, a cross-sectional area of the first main structure 4011 is gradually reduced; a bottom of the first main structure 4011 is provided with an accommodating depression 41 therein.

It will be understood that, in the direction perpendicular to the substrate 10 and from the substrate 10 to the supporting structure 40, a distance between two opposite ends of a cross-section, parallel to a plane where the substrate 10 is located, of the first main structure 4011 is gradually reduced. The accommodating depression 41 is disposed in the bottom of the first main body structure 4011 for the driver chip 30 to be embedded inside.

For example, referring to FIG. 7A, FIG. 7A shows a first supporting structure 401, and the first main structure 4011 included therein is in a shape of a cone; that is, in the direction Z perpendicular to the substrate 10 and from the substrate 10 to the supporting structure 40, an area of a cross-section, parallel to a plane where the substrate 10 is located, of the first main structure 4011 is gradually reduced, and finally reduced to 0. The first main structure 4011 is equivalent to removing a part of a volume of the cylinder on the basis of the cylinder, so as to avoid the change in light path caused by the influence of the first supporting structure 401 on the light emitted by the light-emitting device 20 as much as possible. The bottom of the first main body structure 4011 shown in FIG. 7A is provided therein with an accommodating depression 41 for the driver chip 30 to be embedded inside.

For example, referring to FIG. 7B, FIG. 7B shows another first supporting structure 401, and a first main structure 4011 included therein is formed by cutting off a small cone at the top of a large cone; that is, in the direction Z perpendicular to the substrate 10 and from the substrate 10 to the supporting structure 40, the cross-sectional area of the first main structure 4011 gradually reduced to a constant value, and the constant value is greater than 0. The first main structure 4011 is equivalent to removing a part of a volume of the cone on the basis of the cone to obtain the first supporting structure 401 with a small volume, so as to avoid the change in light path caused by the influence of the first supporting structure 401 on the light emitted by the light-emitting device 20 as much as possible. The bottom of the first main body structure 4011 shown in FIG. 7B is provided therein with an accommodating depression 41 for the driver chip 30 to be embedded inside.

For example, referring to FIG. 7C, FIG. 7C shows yet another first supporting structure 401, which includes a first main structure 4011 in which a lower half is in a shape of a cylinder and an upper half is in a shape of a semi-ellipsoid; that is, in the direction Z perpendicular to the substrate 10 and from the substrate 10 to the supporting structure 40, the cross-sectional area of the first main structure 4011 is gradually reduced, and finally reduces to 0. The first main structure 4011 is equivalent to removing a part of a volume of the cone on the basis of the cone to obtain the first supporting structure 401 with a small volume, so as to avoid the change in light path caused by the influence of the first supporting structure 401 on the light emitted by the light-emitting device as much as possible. The bottom of the first main body structure 4011 shown in FIG. 7C is provided therein with an accommodating depression 41 for the driver chip 30 to be embedded.

In the above embodiments, the structure and shape of the first supporting structure 401 may be selectively designed according to the different requirements of the light-emitting substrate 110 for light-mixing, combined with the type of light emitted by the light-emitting device 20 and the arrangement of the plurality of light-emitting devices 20.

Figure 8A:
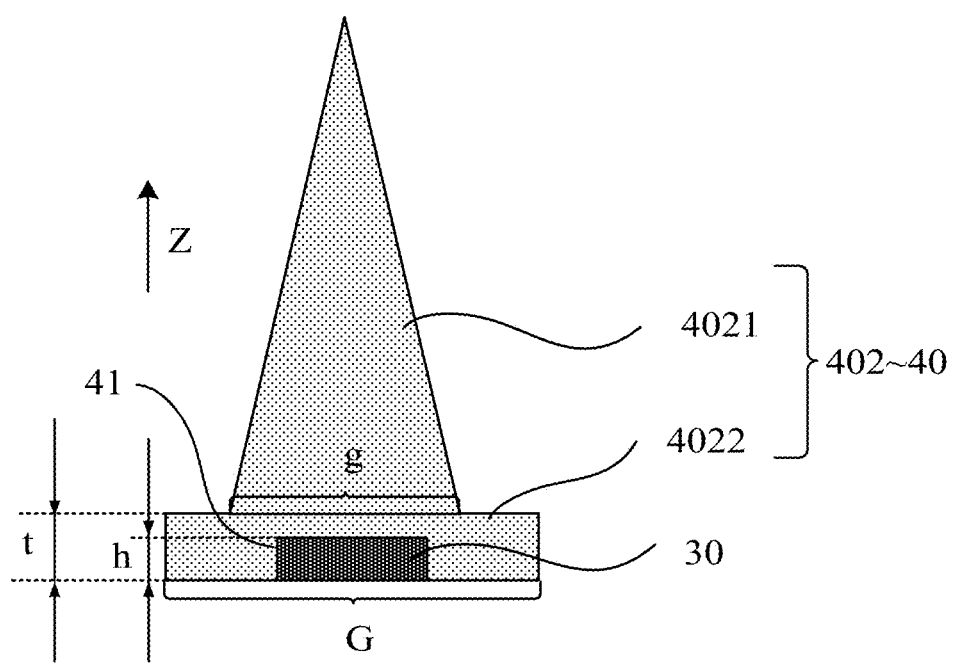
FIG. 8A is a structural diagram of a supporting structure, in accordance with some embodiments of the present disclosure.
Figure 8B:
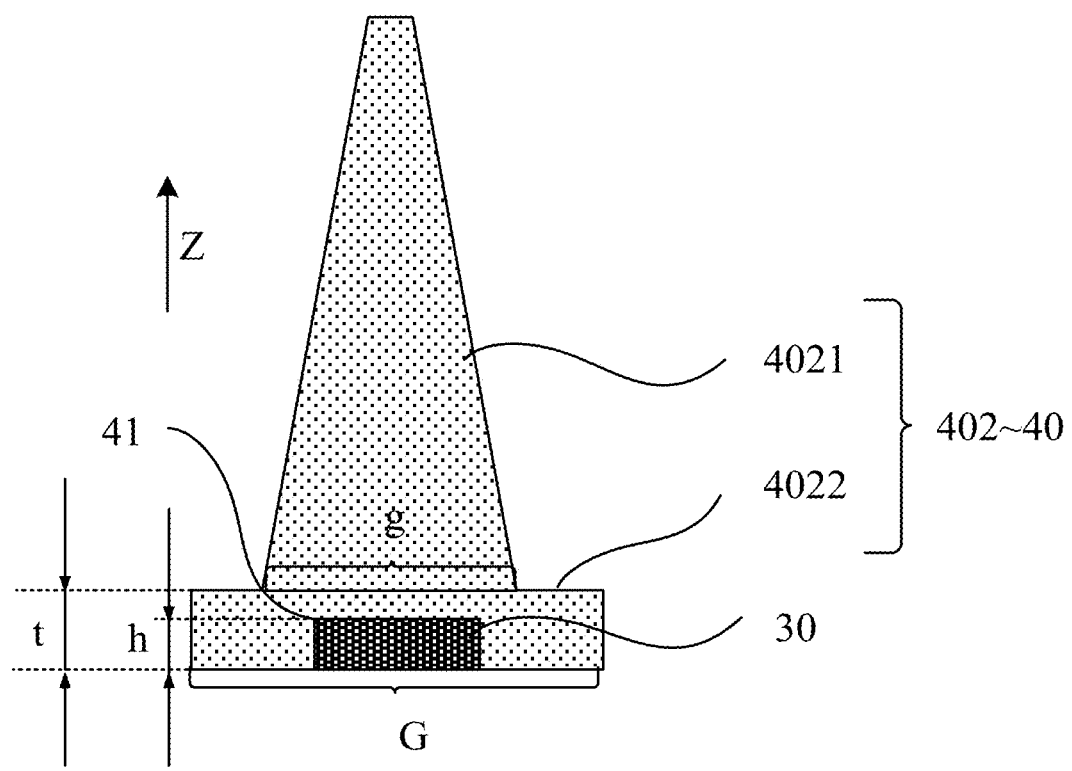
FIG. 8B is a structural diagram of another supporting structure, in accordance with some embodiments of the present disclosure.
Figure 8C:
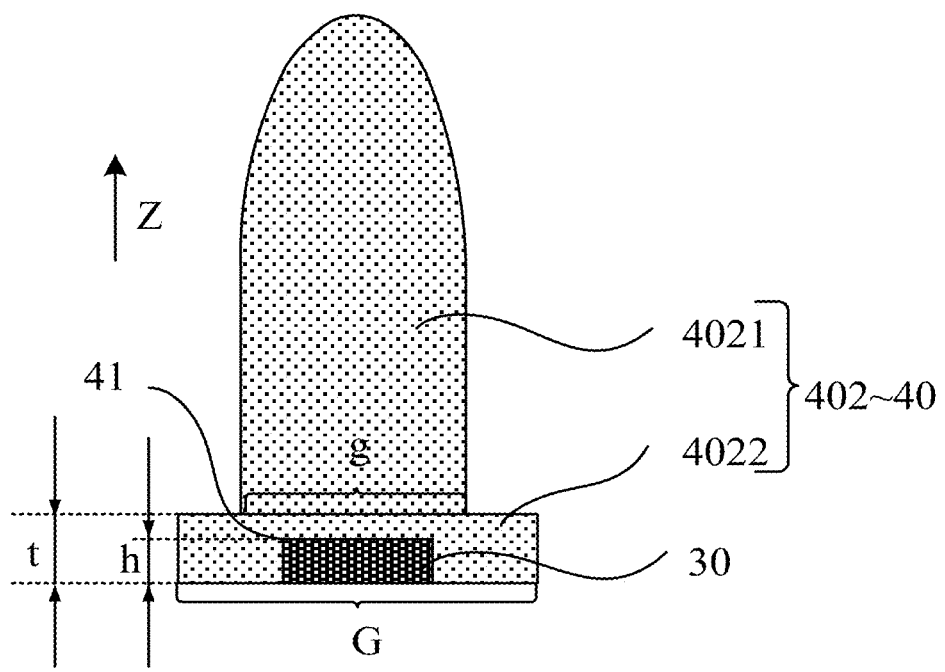
FIG. 8C is a structural diagram of yet another supporting structure, in accordance with some embodiments of the present disclosure.

In some embodiments, as shown in FIGS. 8A to 8C, the supporting structure 40 includes a second supporting structure 402; the second supporting structure 402 includes a second main structure 4021 and a pedestal 4022, and the second main structure 4021 is disposed on a side of the pedestal 4022 away from the substrate 10; in the direction Z perpendicular to the substrate 10 and from the substrate 10 to the supporting structure 40, a cross-sectional area of the second main structure 4021 is gradually reduced; a bottom of the pedestal 4022 is provided with an accommodating depression 41 therein.

It will be understood that, in the direction perpendicular to the substrate 10 and from the substrate 10 to the supporting structure 40, a distance between two opposite ends of a cross-section, parallel to a plane where the substrate 10 is located, of the second main structure 4021 is gradually reduced. The accommodating depression 41 is disposed in the bottom of the pedestal 4022 for the driver chip 30 to be embedded therein.

For example, referring to FIG. 8A, FIG. 8A shows a second supporting structure 402, and the second main body structure 4021 included therein is in a shape of a cone; that is, in the direction Z perpendicular to the substrate 10 and from the substrate 10 to the supporting structure 40, the cross-sectional area of the second main structure 4021 is gradually reduced, and finally reduced to 0. The second main structure 4021 is equivalent to removing a part of a volume of the cone on the basis of the cone to obtain the second supporting structure 402 with a small volume, so as to avoid the change in light path caused by the influence of the second supporting structure 402 on the light emitted by the light-emitting device 20 as much as possible. The bottom of the pedestal 4022 shown in FIG. 8A is provided therein with an accommodating depression 41 for the driver chip 30 to be embedded inside.

For example, referring to FIG. 8B, FIG. 8B shows another second supporting structure 402, and a second main structure 4021 included therein is formed by cutting off a small cone at the top of a large cone; that is, in the direction Z perpendicular to the substrate 10 and from the substrate 10 to the supporting structure 40, the cross-sectional area of the second main structure 4021 gradually reduced to a constant value, and the constant value is greater than 0. The second main structure 4021 is equivalent to removing a part of a volume of the cone on the basis of the cone to obtain the second supporting structure 402 with a small volume, so as to avoid the change in light path caused by the influence of the second supporting structure 402 on the light emitted by the light-emitting device 20 as much as possible. The bottom of the pedestal 4022 shown in FIG. 8B is provided therein with an accommodating depression 41 for the driver chip 30 to be embedded inside.

For example, referring to FIG. 8C, FIG. 8C shows yet another second supporting structure 402, which includes a second main structure 4021 in which a lower half is in a shape of a cylinder and an upper half is in a shape of a semi-ellipsoid; that is, in the direction Z perpendicular to the substrate 10 and from the substrate 10 to the supporting structure 40, the cross-sectional area of the second main structure 4021 is gradually reduced, and finally reduces to 0. The second main structure 4021 is equivalent to removing a part of a volume of the cone on the basis of the cone to obtain the second supporting structure 402 with a small volume, so as to avoid the change in light path caused by the influence of the second supporting structure 402 on the light emitted by the light-emitting device as much as possible. The bottom of the pedestal 4022 shown in FIG. 8C is provided therein with an accommodating depression 41 for the driver chip 30 to be embedded inside.

In the above embodiments, the structure and shape of the second supporting structure 402 may be selectively designed according to the different requirements of the light-emitting substrate 110 for light-mixing, combined with the type of light emitted by the light-emitting device 20 and the arrangement of the plurality of light-emitting devices 20.

With such the above arrangement, in a case where an area of a bottom surface (i.e., a surface proximate to the substrate 10) of the supporting structure 40 remains unchanged, a volume of the supporting structure 40 may be reduced, so as to reduce blocking effect of the supporting structure 40 on the light to increase the amount of light output in the direction perpendicular to the substrate 10 and from the substrate 10 to the supporting structure 40, thereby improving the light extraction efficiency of the light-emitting substrate 110.

In some embodiments, a depth of the accommodating depression 41 is less than a thickness of the pedestal 4022.

For example, as shown in FIGS. 8A to 8C, the depth of the accommodating depression 41 is h, and the thickness of the pedestal 4022 is t, that is, h is less than t.

In some embodiments, the pedestal 4022 is of a boss structure, and an orthographic projection of the second main structure 4021 on the substrate 10 is within an orthographic projection of the pedestal 4022 on the substrate 10.

For example, referring to FIGS. 8A to 8C, the pedestal 4022 is a truncated cone structure, the maximum outline size of the bottom of the second main structure 4021 is g, the maximum outline size of the pedestal 4022 is G, and the orthographic projection of the second main structure 4021 on the substrate 10 is within the orthographic projection of the pedestal 4022 on the substrate 10, that is, g<G.

In some embodiments, a color of an outer surface of the supporting structure 40 is white.

In some embodiments, a reflectivity of the outer surface of supporting structure 40 is greater than 92%.

By setting the color of the outer surface of the supporting structure 40 to white and the reflectivity of the outer surface of the supporting structure 40 is greater than 92%, it may be possible to reduce light absorption and increase the reflection, thereby ensuring or even increasing the light extraction efficiency of the light-emitting device 20, and ensuring or even reducing the overall power consumption of the product.

Figure 12:
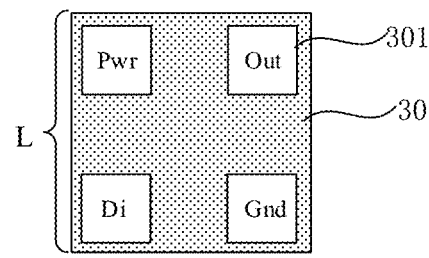
FIG. 12 is a structural diagram of inside of another light-emitting substrate, in accordance with some embodiments of the present disclosure.
Figure 13A:
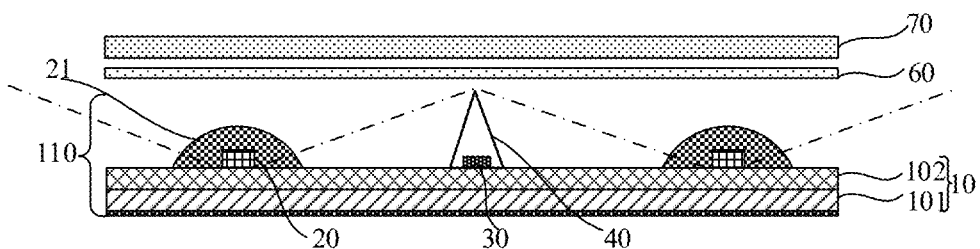
FIG. 13A is a structural diagram of a backlight module, in accordance with some embodiments of the present disclosure.
Figure 13B:
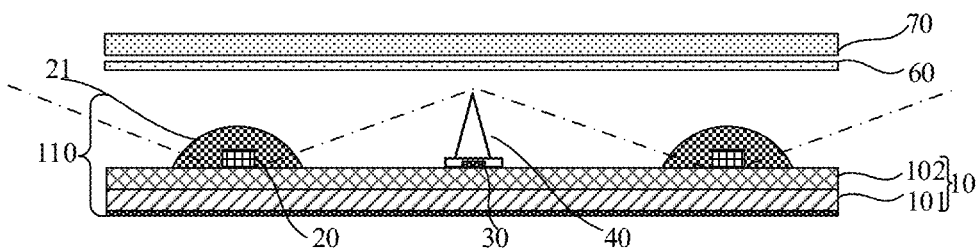
FIG. 13B is a structural diagram of another backlight module, in accordance with some embodiments of the present disclosure.
Figure 14A:
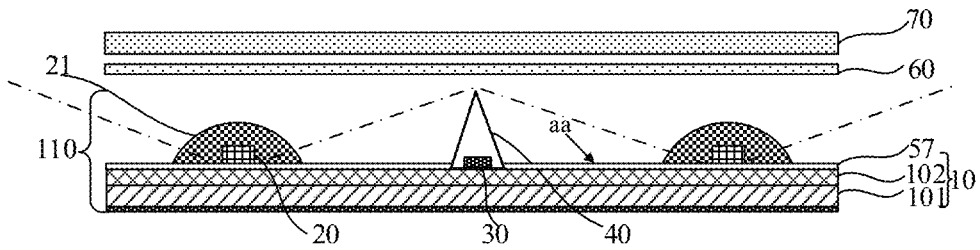
FIG. 14A is a structural diagram of yet another backlight module, in accordance with some embodiments of the present disclosure.
Figure 14B:
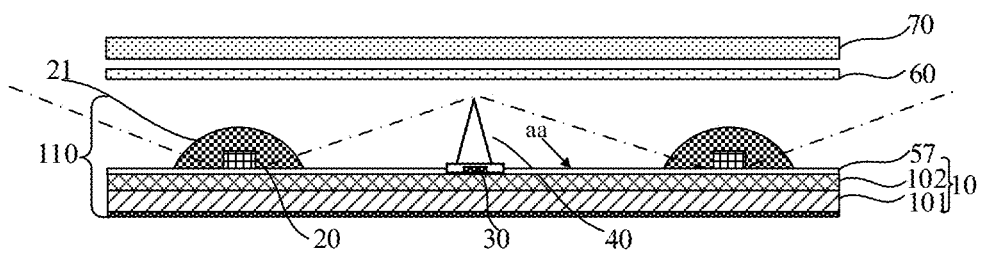
FIG. 14B is a structural diagram of yet another backlight module, in accordance with some embodiments of the present disclosure.

In some embodiments, as shown in FIG. 12, the orthographic projection of the driver chip 30 on the substrate 10 is in a shape of a square, and a side length L of the square is in a range of 3 cm to 3.5 cm, inclusive.

It will be noted that since the driver chip 30 is disposed in the bottom of the supporting structure 40, it is possible to accommodate the driver chip 30 with the side length on the order of centimeters. Compared with the related art, it may be possible to greatly reduce the difficulty of die bonding and improve the welding yield; moreover, it may be possible to increase the area of the integrated circuit inside the driver chip 30, and enrich the functions of the driver chip 30.

Figure 9:
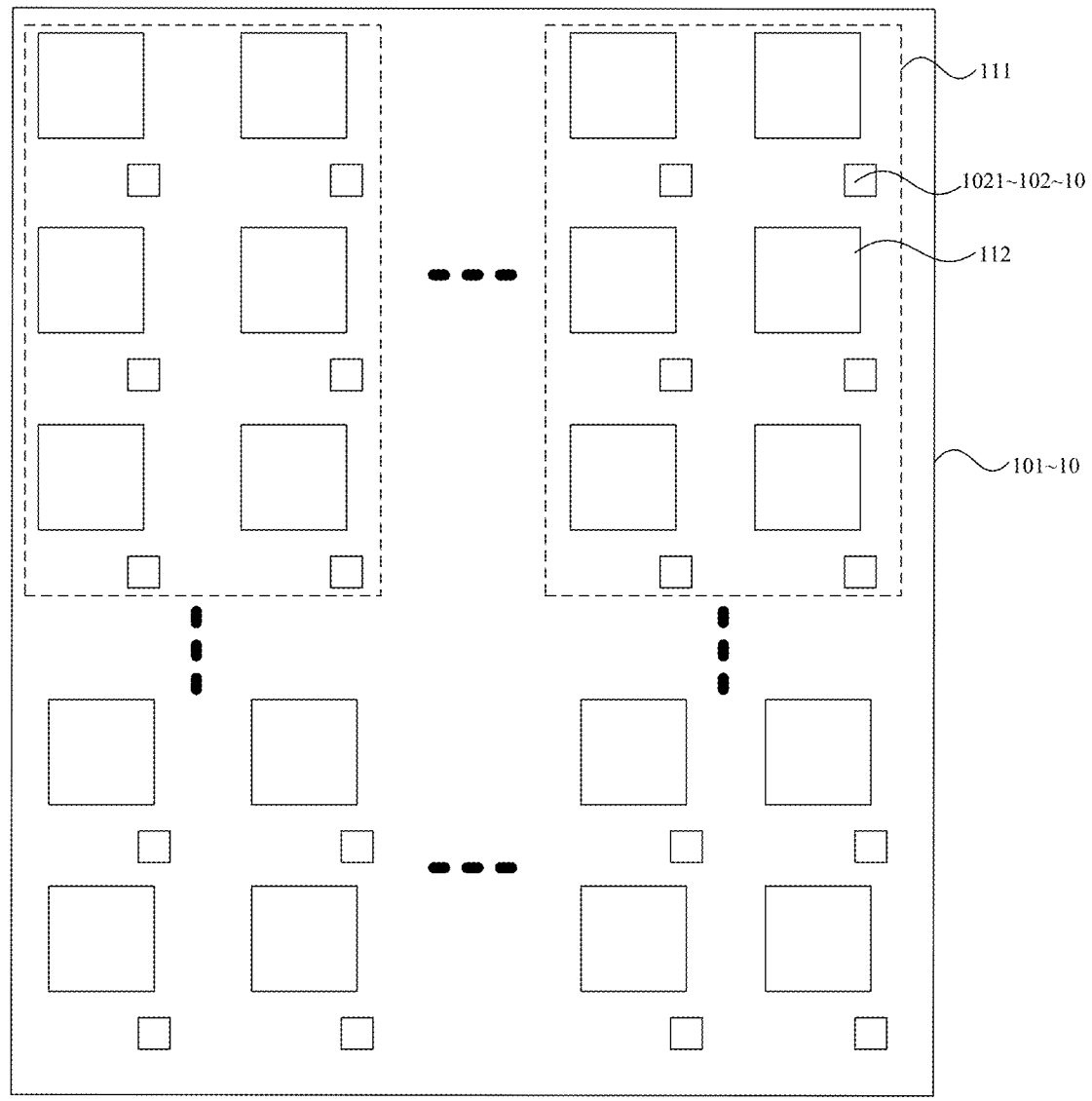
FIG. 9 is a structural diagram of a light exit side of a light-emitting substrate, in accordance with some embodiments of the present disclosure.
Figure 10:
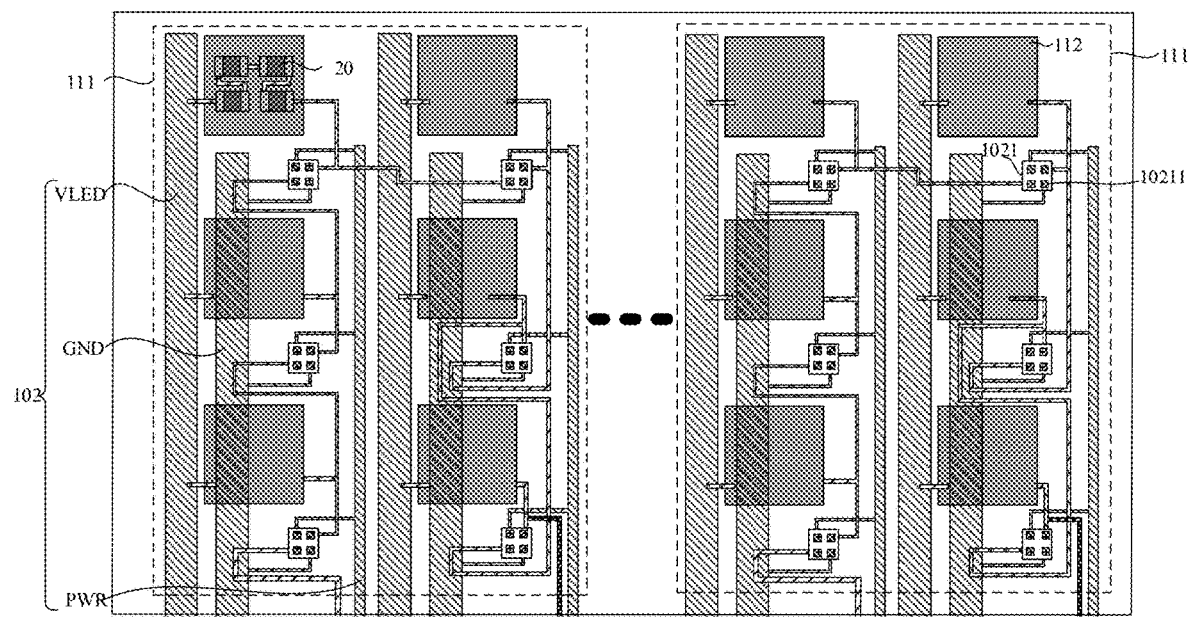
FIG. 10 is a structural diagram of inside of a light-emitting substrate, in accordance with some embodiments of the present disclosure.

In some embodiments, as shown in FIGS. 9, 10 and 12, the driver chip 30 has a plurality of pins 301, and the substrate 10 includes a base 101 and a circuit layer 102 disposed on a side of the base; the circuit layer 102 includes a plurality of connecting pad groups 1021, and each connecting pad group 1021 includes a plurality of connecting pads 10211; the plurality of pins 301 of the driver chip 30 are electrically connected to the plurality of connecting pads 10211 of the connecting pad group 1021, respectively.

In some examples, as shown in FIGS. 9 and 10, the light-emitting substrate 110 includes a plurality of light-emitting regions 111 arranged in an array, and each light-emitting region 111 is provided therein with at least one connecting pad group 1021 and at least one light-emitting group 112; each light-emitting group 112 includes a plurality of light-emitting devices 20, and the plurality of light-emitting devices 20 are evenly arranged around the supporting structure 40, and a distance between each light-emitting device 20 in each light-emitting group 112 and the supporting structure 40 is substantially equal, so as to prevent from blocking the light emitted by the light-emitting device 20 caused by a case that the distance between the supporting structure 40 and any light-emitting device 20 is too small, thereby avoiding uneven light emission of the light-emitting substrate 110. Each light-emitting group 112 is electrically connected to a connecting pad group 1021. The light-emitting substrate 110 further includes a plurality of signal lines, and the plurality of signal lines are located in the circuit layer 102 and pass through the light-emitting region 111. The light-emitting group(s) 112 and the connecting pad group(s) 1021 in the light-emitting region 111 are electrically connected to the corresponding signal lines.

In some embodiments, as shown in FIG. 10, the light-emitting group 112 includes a plurality of light-emitting devices 20. For example, the light-emitting devices 20 may be sub-millimeter light-emitting diodes and/or micro light-emitting diodes. Each light-emitting group 112 may include 4, 6, 8, or 9 light-emitting devices 20, and the plurality of light-emitting devices 20 may be connected in series and/or in parallel.

Figure 11:
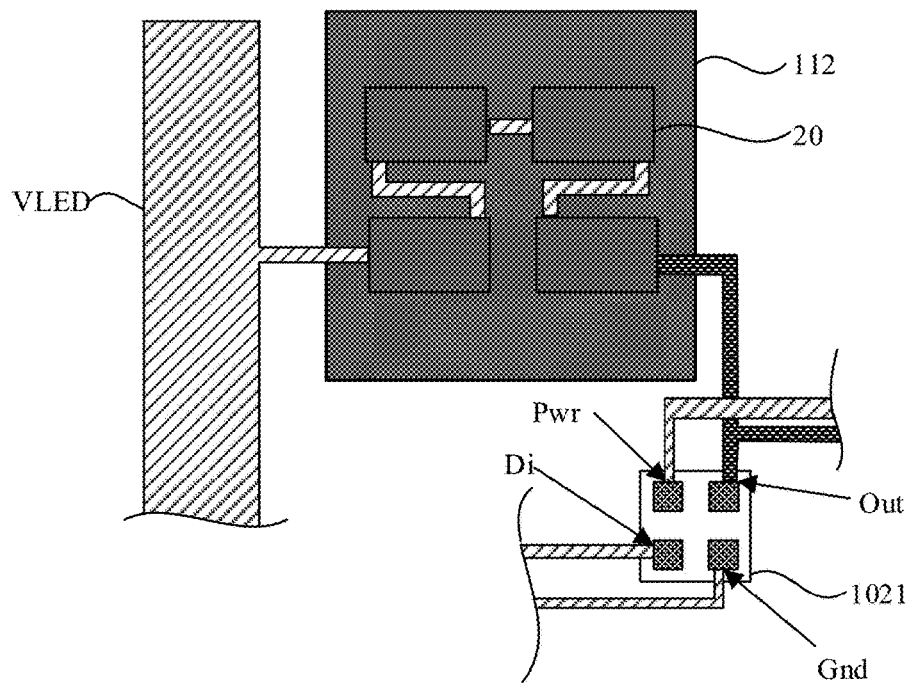
FIG. 11 is a diagram showing a connection structure between a light-emitting group and a connecting pad group, in accordance with some embodiments of the present disclosure.

For example, as shown in FIG. 11, FIG. 11 is a partial enlarged view of FIG. 10, the light-emitting group 112 includes four series-connected light-emitting devices 20; a positive electrode of a first light-emitting device 20 among the four series-connected light-emitting devices 20 is a first end of the light-emitting group 112, and a negative electrode of a last light-emitting device 20 among the four series-connected light-emitting devices 20 is a second end of the light-emitting group 112.

In some embodiments, as shown in FIGS. 10, 11 and 12, the plurality of signal lines include a first power supply voltage signal line VLED, a second power supply voltage signal line PWR, and a third power supply voltage signal line GND. The connecting pad group 1021 includes four connecting pads 10211 (i.e., connecting pads Di, Out, Pwr, and Gnd shown in FIG. 11), which are respectively connected to four pins 301 (a signal input pin Di, a signal output pin Out, a first power supply pin Pwr and a second power supply pin Gnd) of the driver chip 30. A surface of each pin of the driver chip 30 is in a shape of a quadrilateral, and a side length of the quadrilateral may not exceed 90 μm.

As shown in FIGS. 10, 11 and 12, the first end of the light-emitting group 112 is electrically connected to the first power supply voltage signal line VLED, and the first power supply voltage signal line VLED is configured to transmit a third level signal to the light-emitting group 112; for example, the third level signal is a high-level signal. The first power supply pin Pwr of the driver chip 30 is electrically connected to the second power supply voltage signal line PWR through a connecting pad of the connecting pad group 1021, and the second power supply voltage signal line PWR is configured to transmit a second level signal; for example, the second level signal is a high-level signal. The second power supply pin Gnd of the driver chip 30 is electrically connected to the third power supply voltage signal line GND through a connecting pad of the connecting pad group 1021, and the third power supply voltage signal line GND is configured to transmit a first level signal to the driver chip 30; for example, the first level signal is a low-level signal. The second end of each light-emitting group 112 is electrically connected to the output pin Out of the corresponding driver chip 30.

In the embodiments of the present disclosure, "high-level signal" refers to a potential of an electrical signal received or output by a node, a terminal or an output terminal in the circuit. For example, the high-level signal may be 3.3 V or 5 V. "Low-level signal" refers to a potential of an electrical signal received or output by a node, a terminal or an output terminal in the circuit. For example, the low-level signal refers to a ground signal. For example, the low-level signal may be 0 V.

In some examples, the plurality of light-emitting devices 20 are arranged in an array. For example, the light-emitting devices 20 are light-emitting diodes (LEDs) (that is, a size of the light-emitting diode is greater than or equal to 500 µm), and a distance between the light-emitting diodes is greater than 2 mm. That is, the light-emitting diodes serve as a point light source of the backlight module 100.

As shown in FIGS. 3A and 3B, in a case where the light-emitting device 20 is a light-emitting diode, the backlight module 100 further includes a film material group 50 disposed on a side of the plurality of supporting structures 40 away from the substrate 10; the film material group 50 includes, from bottom to top, a diffusion plate 51, a lower diffusion sheet 52, a prism sheet 53 and an upper diffusion sheet 54. The diffusion plate 51 is disposed on a light exit side of the light-emitting substrate 110, that is, the diffusion plate 51 is disposed on a side of the plurality of supporting structures 40 away from the substrate 10; the diffusion plate 51 may be used to provide mechanical support for the lower diffusion sheet 52, the prism sheet 53 and the upper diffusion sheet 54, and diffuse the point light source of the light-emitting devices 20 to enable the point light source is converted into a surface light source. The lower diffusion sheet 52 is located on a side of the diffusion plate 51 away from the light-emitting substrate 110; after the light from the surface light source passes through the diffusion coating arranged in the lower diffusion sheet 54, diffuse reflection is produced, so that the light is evenly distributed to ensure that the luminance of the light exit side of the backlight module 100 is uniform. The prism sheet 53 is disposed on a side of the lower diffusion sheet 52 away from the light-emitting substrate 110 to further improve the luminance of the backlight module 100 within the display region on the light exit side aa. The upper diffusion sheet 54 is located on a side of the prism sheet 53 away from the light-emitting substrate 110, and the upper diffusion sheet 54 is used to protect the display panel 200 from being stained or scratched by the backlight module 100 and other external objects.

In some other examples, the light-emitting devices 20 are may be mini light-emitting diodes (mini LEDs) or micro light-emitting diodes (micro LEDs). The size of the mini LED is greater than or equal to 80 µm and less than 500 µm; the size of the micro LED is less than 50 µm.

As shown in FIGS. 13A, 13B, 14A and 14B, in a case where the light-emitting device 20 is a mini LED and/or a micro LED, another backlight module 100 further includes a quantum dot film 60 and an optical film layer 70. The supporting structure 40 included in the light-emitting substrate 110 is used to support the films to obtain a certain optical distance to eliminate lamp shadows. The light-emitting substrate 110 may emit blue light, and the quantum dot film 60 may include a red quantum dot material, a green quantum dot material and a transparent material. After passing through the red quantum dot material, the blue light emitted by the light-emitting substrate 110 is converted into red light; after passing through the green quantum dot material, the blue light emitted by the light-emitting substrate 110 is converted into green light; after the blue light emitted by the light-emitting substrate 110 passes through the transparent quantum dot material, the color conversion does not occur. Then, the blue light, red light and green light are mixed and superimposed in a certain proportion to appear as white light. The optical film layer 70 may include a diffusion plate 51, a prism sheet 53, or other optical films; the diffusion plate 51 has scattering and diffusion effects and may further mix the white light evenly; the prism sheet 53 may improve the light extraction efficiency of the backlight module 100. The structure of the optical film layer 70 is not specifically limited in the embodiments of the present disclosure.

Figure 15A:
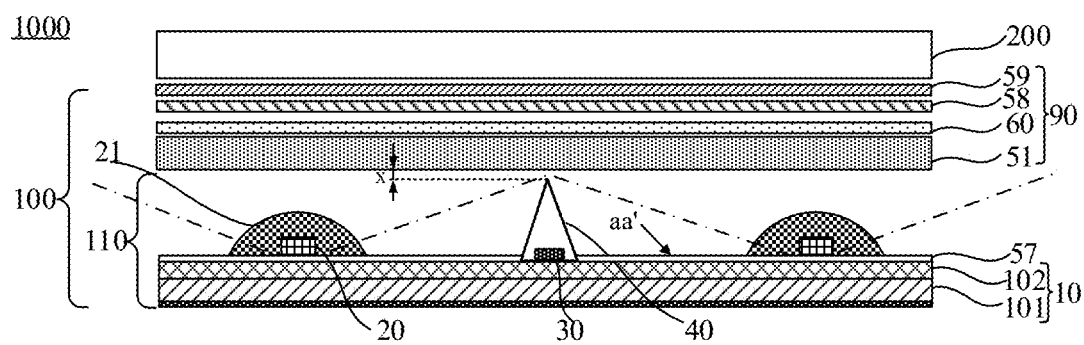
FIG. 15A is a structural diagram of a display apparatus, in accordance with some embodiments of the present disclosure.
Figure 15B:
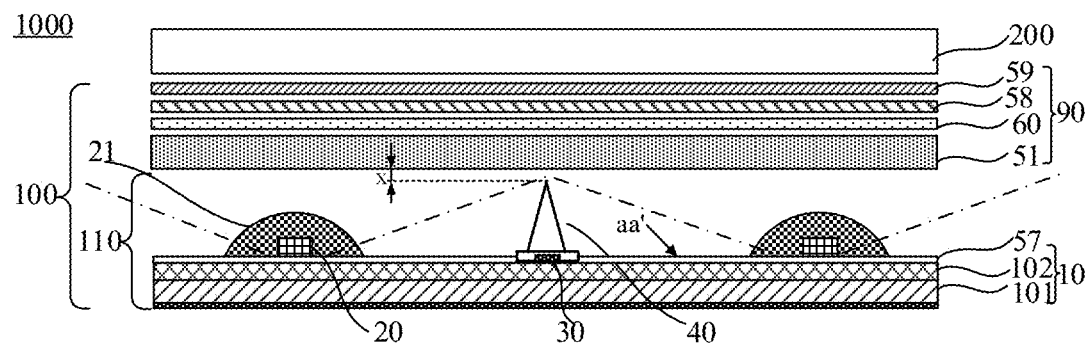
FIG. 15B is a structural diagram of another display apparatus, in accordance with some embodiments of the present disclosure.

In another aspect, some embodiments of the present disclosure provide a backlight module 100, as shown in FIGS. 15A and 15B, the backlight module 100 includes the light-emitting substrate 110 according to any of the embodiments in the above aspect.

In some embodiments, in addition to the light-emitting substrate 110, the backlight module 100 further includes: a diffusion plate 51, a quantum dot film 60, a diffusion sheet 58, and a composite film 59; in this case, the light-emitting substrate 110 further includes a reflective film 57. The plurality of supporting structures 40 are fixed on a light exit side aa' of the light-emitting substrate 110. The reflective film 57 is disposed on the light exit side of the light-emitting substrate 110. The diffusion plate 51 is disposed on a side of the plurality of supporting structures 40 away from the light-emitting substrate 110. The quantum dot film 60 is disposed on a side of the diffusion plate 51 away from the light-emitting substrate 110. The diffusion sheet 58 is disposed on a side of the quantum dot film away from the light-emitting substrate 110. The composite film 59 is disposed on a side of the diffusion sheet away from the light-emitting substrate 110.

For example, as shown in FIGS. 15A and 15B, the plurality of supporting structures 40 are evenly arranged in the light-emitting substrate 110 to support various optical films 90, so that there is a distance between the reflective film 57 of the light-emitting substrate 110 and the optical films 90, and the distance is an optical distance (OD), that is, the light emitted by two adjacent light-emitting devices 20 may be mixed between the reflective film 57 and the optical film 90 (e.g., the diffusion plate 51), which may ameliorate the problem of light shadow of the light-emitting substrate 110, thereby improving the display quality of the display apparatus 1000. The optical films 90 may include the diffusion plate 51, the quantum dot film 60, the diffusion sheet 58 and the composite film 59. The function of each optical film 90 has been described in the above embodiments and will not be repeated here.

In some embodiments, in actual application scenarios, the display surface and the bottom surface of the display apparatus 1000 are perpendicular to each other; as shown in FIGS. 15A and 15B, there is no contact between the diffusion plate 51 and the top ends of the plurality of supporting structures 40, that is, the diffusion plate 51 and the top ends of the plurality of supporting structures 40 have a gap X therebetween; a size of the gap X is in a range of 0.1 mm to 0.2 mm, inclusive. The existence of the gap X may avoid the impact of the surface damage of the diffusion plate 51 on the optical image caused by the friction between the diffusion plate 51 and the top ends of supporting structures 40.

Figure 16:
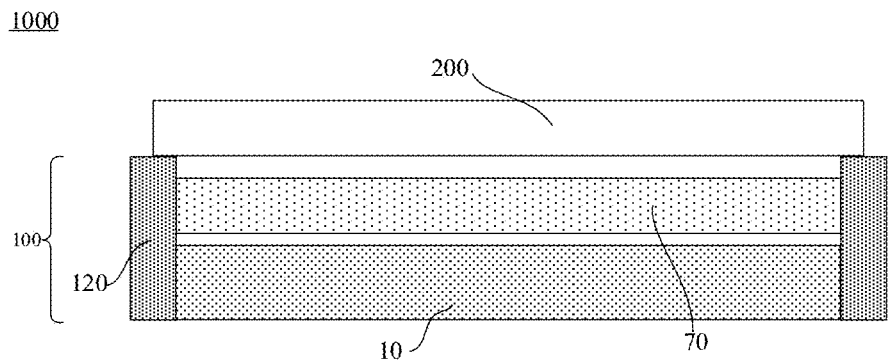
FIG. 16 is a structural diagram of a backlight module, in accordance with some embodiments of the present disclosure.

In some embodiments, referring to FIG. 16, the backlight module 100 further includes a plastic frame 120; the plastic frame 120 encircles the film material group 50. The film material group 50 has a side wall extending in the light exit direction at an edge, and the plastic frame 120 is arranged around an outer peripheral side of the side wall. Supporters are provided around the plastic frame 120.

In yet another aspect, some embodiments of the present disclosure provide a display apparatus 1000. As shown in FIGS. 15A and 15B, the display apparatus 1000 includes the backlight module 100 according to any of the embodiments in the above aspect and a display panel 200, and the display panel 200 is stacked on the light exit side aa of the backlight module 100.

For example, the display apparatus 100 includes the backlight module 100 provided by the above embodiments, and has the same effect and function as the backlight module 100; the display apparatus 100 may be a mobile telephone, a wireless device, a personal digital assistant (PDA), a hand-held or portable computer, a global positioning system (GPS) receiver/navigator, a camera, an MPEG-4 Part 14 (MP4) video player, a video camera, a game console, a watch, a clock, a calculator, a television (TV) monitor, a flat-panel display, a computer monitor, a car display (e.g., an odometer display), a navigator, a cockpit controller and/or display, a camera view display (e.g., a rear view camera display in a vehicle), an electronic photo, an electronic billboard or sign, a projector, or a packaging and aesthetic structure (e.g., a display for displaying an image of a piece of jewelry).

Figure 17:
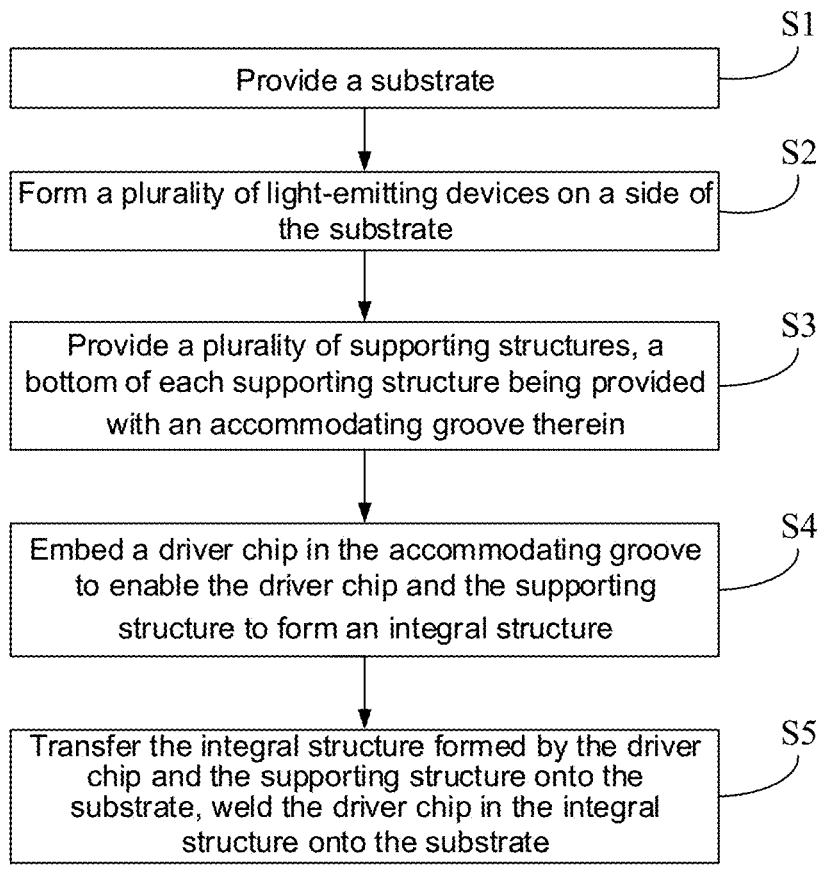
FIG. 17 is a flow diagram of a method for manufacturing a light-emitting substrate, in accordance with some embodiments of the present disclosure.

As shown in FIG. 17, some embodiments of the present disclosure provide a method for manufacturing a light-emitting substrate 100. The method includes the following steps.

In S1, a substrate is provided.

It will be noted that the substrate 10 includes a base 101 and a circuit layer 102 provided on a side of the base. The circuit layer 102 includes a plurality of connecting pad groups 1021, and each connecting pad group 1021 includes a plurality of connecting pads 10211. The light-emitting device 20 and the pins 301 of the driver chip 30 are electrically connected to the connecting pads 10211 in the connecting pad group 1021. It will be understood that the number of connecting pads included in the connecting pad group corresponds to the number of pins of the electronic components to which the connecting pad group is electrically connected.

In S2, a plurality of light-emitting devices 20 are formed on a side of the substrate 10.

For example, the plurality of light-emitting devices 20 are arranged in an array on the substrate 10.

In S3, a plurality of supporting structures 40 are provided, a bottom of each supporting structure 40 is provided with an accommodating depression 41 therein.

For example, the accommodating depression 41 is a rectangular groove, the depth is consistent with the thickness of the driver chip 30, and the orthographic projection of the accommodating depression 41 on the substrate 10 is slightly greater than the orthographic projection of the driver chip 30 on the substrate 10.

It will be noted that the orthographic projections of the plurality of light-emitting devices 20 on the substrate 10 do not overlap with the orthographic projections of the plurality of supporting structures 40 on the substrate 10. Therefore, during the process of manufacturing the light-emitting substrate 110, the order of S2 and S3 is not limited here.

In S4, the driver chip 30 is embedded in the accommodating depression 41, so that the driver chip 30 and the supporting structure 40 form an integral structure.

It will be understood that after the card slot 42 and the supporting structure 40 are accurately positioned, the card slot 42 is placed in the accommodating depression 41, so that the driver chip 30 is fixedly embedded in the accommodating depression 41 by applying the transparent adhesive to the space between the opening 421 of the card slot 42 and the driver chip 30 to achieve the fixation of the driver chip 30. As a result, the driver chip 30 and the supporting structure 40 form an integral structure. In addition to supporting the optical films 90, the supporting structure 40 may also cover the driver chip 30 to protect the driver chip 30, so that the display quality of the display apparatus 1000 is improved.

In S5, the integral structure formed by the driver chip 30 and the supporting structure 40 is transferred onto the substrate 10, and the driver chip 30 in the integral structure is welded onto the substrate 10.

For example, after the integral structure formed by the driver chip 30 and the supporting structure 40 is transferred onto the substrate 10 and accurately aligned, the plurality of pins 301 of the driver chip 30 are welded onto the substrate 10, that is, the integral structure formed by the driver chip 30 and the supporting structure 40 is fixed to the substrate.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
  a substrate;
  a plurality of light-emitting devices disposed on a side of the substrate;
  a plurality of driver chips disposed on the side of the substrate and each being electrically connected to at least one light-emitting device; and
  a plurality of supporting structures disposed on the side of the substrate; wherein a driver chip of the plurality of driver chips is covered by a supporting structure of the plurality of supporting structures;
  wherein a bottom of the support structure is provided with an accommodating depression therein, and the driving chip is fixedly embedded in the accommodating depression, so that the support structure serves as an encapsulation structure of the driving chip to enable the driver chip and the supporting structure to form an integral structure, wherein the driver chip is connected to the supporting structure through a transparent adhesive, other surfaces of the driver chip except a bottom surface away from the supporting structure are embedded and cured in the accommodating depression through the transparent adhesive; and wherein an area of an orthographic projection of the accommodating depression on the substrate is greater than an area of an orthographic projection of the driver chip on the substrate, and the orthographic projection of the driver chip on the substrate is within the orthographic projection of the accommodating depression on the substrate.

2. The light-emitting substrate according to claim 1, wherein a surface of the driver chip proximate to the substrate is flush with a surface of the bottom of the supporting structure.

3. The light-emitting substrate according to claim 2, wherein the accommodating depression is disposed at a middle of the bottom of the supporting structure.

4. The light-emitting substrate according to claim 1, wherein the supporting structure includes a first supporting structure, the first supporting structure includes a first main structure; in a direction perpendicular to the substrate and from the substrate to the supporting structure, a cross-sectional area of the first main structure is gradually reduced; a bottom of the first main structure is provided with the accommodating depression therein.

5. The light-emitting substrate according to claim 1, wherein the supporting structure includes a second supporting structure, the second supporting structure includes a second main structure and a pedestal, and the second main structure is disposed on a side of the pedestal away from the substrate; in a direction perpendicular to the substrate and from the substrate to the supporting structure, a cross-sectional area of the second main structure is reduced; a bottom of the pedestal is provided with the accommodating depression therein.

6. The light-emitting substrate according to claim 5, wherein a depth of the accommodating depression is less than a thickness of the pedestal.

7. The light-emitting substrate according to claim 6, wherein an orthographic projection of the second main structure on the substrate is within an orthographic projection of the pedestal on the substrate.

8. The light-emitting substrate according to claim 1, wherein a color of an outer surface of the supporting structure is white.

9. The light-emitting substrate according to claim 8, wherein a reflectivity of the outer surface of the supporting structure is greater than or equal to 92%.

10. The light-emitting substrate according to claim 1, wherein an orthographic projection of the driver chip on the substrate is in a shape of a square, and a side length of the square is in a range of 3 cm to 3.5 cm, inclusive.

11. The light-emitting substrate according to claim 10, wherein the driver chip has a plurality of pins; the substrate includes a base and a circuit layer disposed on a side of the base, the circuit layer includes a plurality of connecting pad groups, and each connecting pad group includes a plurality of connecting pads; the plurality of pins of the driver chip are electrically connected to a plurality of connecting pads in a connecting pad group, respectively.

12. A backlight module, comprising:
the light-emitting substrate according to claim 1; and
a film material group disposed on a side of the plurality of supporting structures away from the substrate.

13. The backlight module according to claim 12, wherein the film material group includes:
a diffusion plate disposed on the side of the plurality of supporting structures away from the substrate;
a lower diffusion sheet disposed on a side of the diffusion plate away from the light-emitting substrate;
a prism sheet disposed on a side of the lower diffusion sheet away from the light-emitting substrate; and
an upper diffusion sheet disposed on a side of the prism sheet away from the light-emitting substrate.

14. The backlight module according to claim 13, wherein the diffusion plate and top ends of the plurality of supporting structures have a gap therebetween, and a size of the gap is in a range of 0.1 mm to 0.2 mm, inclusive.

15. The backlight module according to claim 14, wherein the backlight module further comprises a plastic frame, the plastic frame encircling the film material group, wherein the film material group has a side wall extending in a light exit direction at an edge, the plastic frame is arranged around an outer peripheral side of the side wall.

16. A display apparatus, comprising:
the backlight module according to claim 12; and
a display panel stacked on a light exit side of the backlight module.

17. A method for manufacturing a light-emitting substrate, the method comprising:
providing a substrate;
forming a plurality of light-emitting devices on a side of the substrate;
providing a plurality of supporting structures, a bottom of each supporting structure being provided with an accommodating depression therein;
fixedly embedding a driver chip in the accommodating depression and to enable the driver chip and the supporting structure, so that the support structure serves as an encapsulation structure for the driving chip to enable the driver chip and the supporting structure to form an integral structure;
transferring the integral structure formed by the driver chip and the supporting structure onto the substrate; and
welding the driver chip in the integral structure onto the substrate.

* * * * *